United States Patent
Hoogzaad et al.

(10) Patent No.: US 10,862,524 B2
(45) Date of Patent: Dec. 8, 2020

(54) RF SWITCH

(71) Applicant: NXP B.V., Eindhoven (NL)

(72) Inventors: Gian Hoogzaad, Mook (NL); Denizhan Karaca, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/253,605

(22) Filed: Jan. 22, 2019

(65) Prior Publication Data

US 2019/0238172 A1 Aug. 1, 2019

(30) Foreign Application Priority Data

Jan. 30, 2018 (EP) .................................... 18154266

(51) Int. Cl.
| | |
|---|---|
| H04B 1/40 | (2015.01) |
| H04B 1/48 | (2006.01) |
| H03F 3/21 | (2006.01) |
| H03K 17/62 | (2006.01) |
| H03K 17/76 | (2006.01) |

(52) U.S. Cl.
CPC ............... H04B 1/40 (2013.01); H03F 3/21 (2013.01); H03K 17/62 (2013.01); H03K 17/76 (2013.01); H04B 1/48 (2013.01); H03F 2200/451 (2013.01)

(58) Field of Classification Search
None
See application file for complete search history.

(56) References Cited

U.S. PATENT DOCUMENTS

| | | | |
|---|---|---|---|
| 6,434,368 B1 | 8/2002 | Stadmark | |
| 6,804,502 B2* | 10/2004 | Burgener | H01P 1/15 455/333 |
| 7,796,969 B2 | 9/2010 | Kelly et al. | |
| 7,910,993 B2* | 3/2011 | Brindle | H01L 29/78609 257/347 |
| 9,209,784 B2* | 12/2015 | Iversen | H03K 17/102 |
| 10,361,697 B2* | 7/2019 | Zhu | H04B 1/48 |
| 2010/0230787 A1* | 9/2010 | Guiraud | H01L 29/66181 257/532 |
| 2011/0140763 A1 | 6/2011 | Noh et al. | |
| 2011/0140764 A1 | 6/2011 | Shin et al. | |
| 2014/0128009 A1 | 5/2014 | Yeh et al. | |
| 2016/0344431 A1* | 11/2016 | Srirattana | H04B 1/40 |
| 2018/0048305 A1* | 2/2018 | Jin | H01L 23/66 |

FOREIGN PATENT DOCUMENTS

| | | |
|---|---|---|
| EP | 2940866 A3 | 11/2015 |
| GB | 2273423 A | 6/1994 |
| WO | 0041326 | 7/2000 |
| WO | 2011149596 A1 | 12/2011 |

* cited by examiner

*Primary Examiner* — Cassandra F Cox

(57) ABSTRACT

An RF switch for connecting an antenna to a transceiver is described. The RF switch includes a first switchable capacitor arranged between a first terminal and a common terminal and a second switchable capacitor arranged between a second terminal and the common terminal. Each of the first and second switchable capacitors are switchable between a pass state and a blocking state. The capacitance value in the pass state is higher than the capacitance value in the blocking state.

20 Claims, 5 Drawing Sheets

300

350

360

RF SWITCH

CROSS-REFERENCE TO RELATED APPLICATIONS

This application claims the priority under 35 U.S.C. § 119 of European Patent application no. 18154266.3, filed on 30 Jan. 2018, the contents of which are incorporated by reference herein.

FIELD

This disclosure relates to an RF switch for an antenna.

BACKGROUND

Mobile communication systems such as base stations or mobile devices such as mobile phones typically include an RF (radio-frequency) front-end which connects a transceiver to one or more antennas via one or more RF switches. RF front ends including such RF switches which are typically implemented as a SPDT (single pole double throw) switch may connect the antenna either to a low noise amplifier (LNA) in a receive mode of the transceiver so that an RF signal may be received, or to a power amplifier (PA) in a transmit mode of the transceiver so that an RF signal may be transmitted. A key performance requirement of the RF switch function is the insertion loss (IL). The insertion loss directly adds to the noise figure (NF) when the transceiver is in a receive mode which in turn may determine the sensitivity of the receiver. The RF switch IL factor also affects the power output requirement for the PA in the transmit mode of the transceiver. An increased power output requirement results in an increased PA current consumption which in turn may cause an undesired increase in the temperature of an integrated circuit including the RF front-end circuitry.

SUMMARY

Various aspects of the disclosure are defined in the accompanying claims. In a first aspect there is provided a RF switch for connecting an antenna to a transceiver, the RF switch comprising a first switchable capacitor arranged between a first terminal and a common terminal and a second switchable capacitor arranged between a second terminal and the common terminal, wherein each of the first and second switchable capacitors are switchable between a pass state and a blocking state wherein the capacitance value in the pass state is higher than the capacitance value in the blocking state.

In one or more embodiments, the RF switch may further comprise a bias circuit having a control input and configured to bias the bipolar transistors in either the blocking state or the pass state in response to a control signal in the control input.

In one or more embodiments, the RF switch may further comprise a first resonator circuit coupled to the first terminal, a second resonator circuit coupled to the second terminal and a third resonator coupled to the common terminal wherein the impedance of each resonator circuit is higher at RF frequencies than at DC.

In one or more embodiments, the first, second and third resonator circuits may be coupled to the bias circuit.

In one or more embodiments, the first, second and third resonator circuits may comprise self-resonating coils.

In one or more embodiment of the RF switch, the bias circuit may be configured to supply a bias forward current to a respective bipolar transistor in the pass state and a reverse bias voltage to a respective bipolar transistor in the blocking state.

In one or more embodiment of the RF switch, the bias circuit may comprise a power-dependent adaptive current source configured to supply the bias forward current in dependence of the power of the RF signal.

In one or more embodiment of the RF switch, the bias circuit may comprise a first switchable current source coupled to the first terminal, a first switchable voltage source coupled to the first terminal, a second switchable current source coupled to the second terminal, a second switchable voltage source coupled to the second terminal, and a common switchable voltage source coupled to the common terminal, wherein in a first mode of operation, the RF switch is configured to enable the first switchable current source, the second switchable voltage source and the common switchable voltage source to configure the first switchable capacitor in a pass state and the second switchable capacitor in a blocking state and in a second mode of operation to enable the second switchable current source, the first switchable voltage source and the common switchable voltage source to configure the first switchable capacitor in a blocking state and the second switchable capacitor in a pass state.

In one or more embodiments of the RF switch, the bias circuit may comprise a current source coupled to the common terminal, a first switchable voltage source coupled to the first terminal, and a second switchable voltage source coupled to the second terminal, wherein in a first mode of operation, the RF switch is configured to enable the first switchable voltage source, the second switchable voltage source to configure the first switchable capacitor in a pass state and the second switchable capacitor in a blocking state and in a second mode of operation to enable the first switchable voltage source and the second switchable voltage source to configure the first switchable capacitor in a blocking state and the second switchable capacitor in a pass state.

In one or more embodiments of the RF switch, each of the first and second switchable capacitors may comprise a respective bipolar transistor having a base connected to the emitter.

In one or more embodiments, the collector of the first bipolar transistor and the emitter of the second bipolar transistor are connected to the common terminal.

In one or more embodiments of the RF switch, the emitter of the first bipolar transistor and the emitter of the second bipolar transistor may be connected to the common terminal.

In one or more embodiments of the RF switch, the first and second switchable capacitor may comprise one of a silicon diode, a silicon germanium diode, a PiN diode, a diode-connected bipolar transistor and a varicap.

In one or more embodiments, the RF switch may be configured as a SPDT switch wherein the common terminal is configured to be coupled to an antenna, the first terminal is configured to be coupled to an RF amplifier output and the second terminal is configured to be coupled to an RF amplifier input, and wherein a first mode one of the first terminal and the second terminal is coupled to the common terminal and in a second mode the other of the first terminal and the second terminal is coupled to the common terminal.

One or more embodiments of the RF switch may be included in a mobile device. One or more embodiments of the RF switch may be included in a 5G transceiver.

BRIEF DESCRIPTION OF THE DRAWINGS

In the figures and description like reference numerals refer to like features. Embodiments of are now described in detail, by way of example only, illustrated by the accompanying drawings in which.

DESCRIPTION

Figure 1:
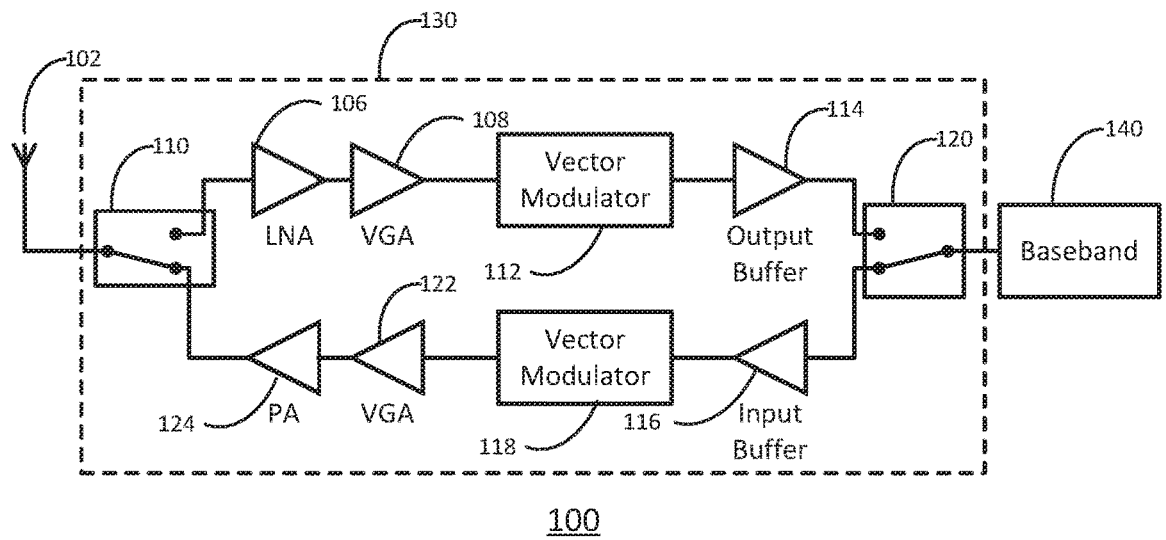
FIG. 1 Shows an example 5G RF transceiver for a mobile device or a base station showing one channel.

FIG. 1 Shows an example 5G RF system 100 for a mobile device or a base station. A 5G system typically utilises higher frequency bands for example at frequencies in the region of 28 GHz and 39 GHz. 5G systems typically exploit beamforming techniques to steer the RF energy to where it is required. By steering the RF energy, the amount of power required may be reduced and furthermore steering the RF energy may also help prevent spectral pollution. Beamforming typically requires multiple antennas and consequently multiple RF front ends. The 5G RF system 100 may include an antenna 102, an RF channel 130, and a baseband circuit 140. The baseband circuit 140 may include RF mixers and other analog and/or digital circuitry.

The 5G RF system 100 is illustrated showing one RF front end channel 130, and one antenna 102, but it will be appreciated that multiple channels and antennas will be used in a typical 5G system.

The RF channel 130 may include a first RF SPDT switch 110 having a common connection to the antenna 102. The RF channel 130 may include a second RF SPDT switch 120 having a common connection to baseband circuit 140. The RF channel 130 further includes a receive path which may consist of a series arrangement of a low noise amplifier (LNA) 106, a variable gain amplifier (VGA) 108, a vector modulator 112, and an output buffer 114 connected between the first RF switch 110 and the second RF switch 120. The RF channel 130 further includes a transmit path which may consist of a series arrangement of an input buffer 116 a vector modulator 118, a variable gain amplifier 122, and a power amplifier 124 connected between the second RF switch 120 and the first RF switch 110. The first RF switch 110 may also be referred to as an antenna switch.

In the transmit mode of operation the first RF switch 110 and the second RF switch 120 are controlled by a control circuit (not shown) to select the transmit path. In this mode, the baseband circuit 140 is connected to the input of the input buffer 116 via the second RF switch 120, and the output of the power amplifier 124 is connected to the antenna 102 via the first RF switch 110.

In the receive mode of operation, the first RF switch 110 and the second RF switch 120 are controlled by a control circuit (not shown) to select the receive path. In this mode, the antenna 102 is connected to the input of the low noise amplifier 106 via the second RF switch 120 and the output of the output buffer 114 is connected to the baseband circuit 140 via the first RF switch 110.

For multiple antenna systems, further switches may be used to combine multiple receive output signals from output buffers in the receive mode of operation or to split multiple transmit input signals for each input buffer in a respective channel. Additionally, bandpass filters may be included between the first RF switch 110 and the antenna 102. It is desirable for the RF switches 110, 120 to have a low insertion loss value while still meeting other requirements such as linearity, breakdown voltage performance, switching time, and noise figure.

Figure 2:
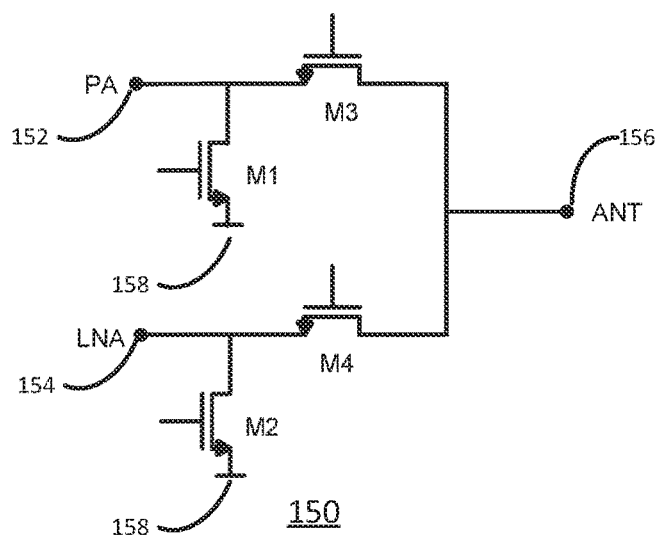
FIG. 2 shows a typical RF SPDT switch implemented using MOS transistors.

FIG. 2 shows a typical RF SPDT antenna switch 150 implemented using n-type MOS transistors. MOSFET devices may be implemented for example in a BiCMOS SiGe technology. A first NFET M1 has a source connected to a ground potential 158 and a drain connected to a first terminal 152 which may be connected to a power amplifier output (not shown). A second NFET M2 has a source connected to the ground potential 158 and a drain connected to a second terminal 154 which may be connected to a low noise amplifier input (not shown). A third NFET M3 has a source connected to the first terminal 152 and a drain connected to the antenna terminal 156. A fourth NFET M4 has a source connected to the second terminal 154 and a drain connected to the common or antenna terminal 156. The gate connections of transistors M1, M2, M3, and M4 are connected to control circuitry (not shown).

In operation of the antenna switch 150, in a transmit mode when transistors M2 and M3 are turned on, transistors M1 and M4 will be turned off. In this mode of operation, an antenna connected to the antenna terminal 156 will be connected to the first terminal 152 which may be connected to a power amplifier. In a receive mode of operation, transistors M1 and M4 are turned on and transistors M2 and M3 are turned off. In the receive mode of operation, the second terminal 154 will be connected to the antenna terminal 156 and a low noise amplifier input connected to the second terminal 154 will be able to receive signals from an antenna connected to the antenna terminal 156.

The antenna switch 150 typically has a relatively high insertion loss which may be approximately 1.5 dB. This insertion loss may be due to the on-resistance of the MOSFET. The insertion loss may also be due to large parasitic capacitances between the MOSFET drain and/or source to the gate and the substrate.

Figure 3:
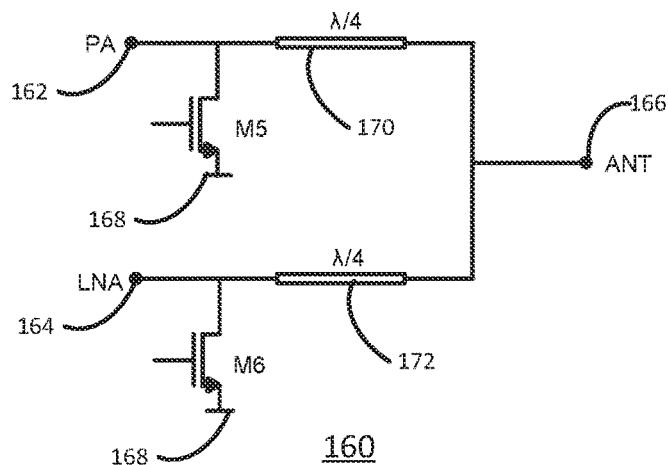
FIG. 3 illustrates a typical RF SPDT switch implemented using transmission lines instead of series switches.

FIG. 3 shows an alternative typical RF SPDT switch 160 that uses transmission lines (TL) to avoid the use of series switches. A first NFET M5 has a source connected to a ground potential 168 and a drain connected to a first terminal 162 which may be connected to a power amplifier output (not shown). A second NFET M6 has a source connected to the ground potential 168 and a drain connected to a second terminal 164 which may be connected to a low noise amplifier input (not shown). A first quarter-wavelength (λ/4) transmission line 170 is connected between the first terminal 162 and the antenna terminal 166. A second quarter-wavelength (λ/4) transmission line 172 is connected between the second terminal 164 and the antenna terminal 166. The gate connections of transistors M5 and M6 are connected to control circuitry (not shown).

In a transmit mode of operation, the first transistor M5 will be switched off and the second transistor M6 will be switched on. The second transmission line 172 will act as an impedance inverter and invert the low on state impedance of the second transistor M6 to an open at the antenna terminal. This enables a RF signal to flow in the branch between the first terminal 162 and the antenna terminal 166.

In a receive mode of operation, the first transistor M5 will be switched on and the second transistor M6 will be switched off. The first transmission line 170 will invert the low on state impedance of the first transistor M5 to an open at the antenna. This enables an RF signal to flow in the branch between the second terminal 164 and the antenna terminal 166.

The RF switch 160 may be used at high frequencies, for example frequencies above 10 GHz. However, the insertion loss may still be relatively high. Furthermore when the transmission lines 170, 172 are implemented as a micro strip line or co-planar waveguide on an integrated circuit. They may be bulky which may result in further losses. When the transmission lines are implemented with lumped elements such as inductors or capacitors, the RF switch 160 may be lossy because of the low Q factor of the on-chip inductors or coils.

Figure 4:
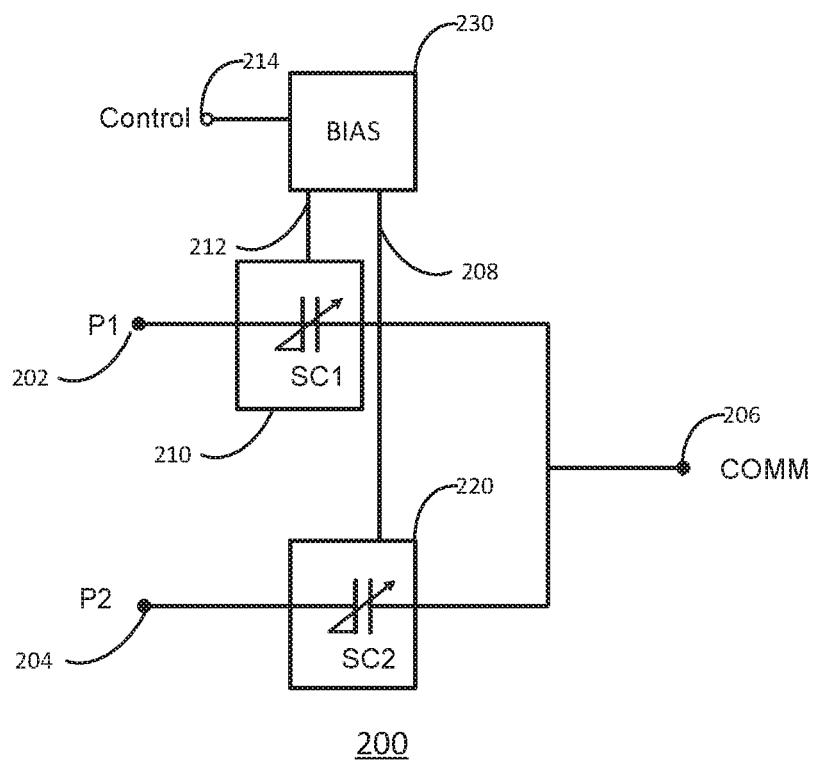
FIG. 4 shows an RF SPDT switch according to an embodiment.

FIG. 4 shows an RF switch 200 according to an embodiment. A first switchable capacitor 210 is connected between a first terminal 202 and a common terminal 206. A second switchable capacitor 220 is connected between a second terminal 204 and the common terminal 206. A control circuit 230 which may be considered a bias circuit may have a control input 214. The bias circuit 230 may have a first control output 212 connected to the first switchable capacitor 210. The bias circuit 230 may have a second control output 208 connected to the second switchable capacitor 220.

In operation, the first switchable capacitor 210 and the second switchable capacitor 220 may be configured in either a blocking state or a pass state determined by a control signal received on the control input 214. The received control signal in turn determines the control signals provided to the first switchable capacitor 210 on first control output 212 and the second switchable capacitor 220 on the second control output 208. If used as an antenna switch, the first terminal 202 may be connected to a power amplifier output (not shown), the second terminal 204 may be connected to a low noise amplifier input (not shown) and the common terminal 206 may be connected to an antenna.

The switchable capacitors 210,220 may be considered to be in the blocking state or off state when a desired RF signal is substantially blocked from the path between either the first terminal 202 and the common terminal 206 or the second terminal 204 and the common terminal 206.

The switchable capacitors 210,220 may be considered to be in the pass state or on state when a desired RF signal can pass through the path between either the first terminal 202 and the common terminal 206 or the second terminal 204 and the common terminal 206.

The bias circuit 230 is configured such that in a first mode of operation the first switchable capacitor 210 is in a blocking state and the second switchable capacitor 220 is in a pass state, and in a second mode of operation the first switchable capacitor 210 is in a pass state and a second switchable capacitor 220 is in a blocking state. The bias circuit 230 may be further configured so that both first switchable capacitor 210 and the second switchable capacitor 220 are in a blocking state when neither transmit or receive functionality is required.

When the first switchable capacitor 210 or the second switchable capacitor 220 are in the blocking state or off, the capacitance of the respective switchable capacitor 210, 220 is relatively small. When the first switchable capacitor 210 or the second switchable capacitor 220 are in the pass-state or on, the capacitance of the respective switchable capacitor 210, 220 is relatively large.

When the value of capacitance C in the pass state is large enough relative to the operational frequency ω and impedance level Z, that is to say C>>1/ωZ with Z typically 50Ω, the switchable capacitors 210, 220 may function to couple an AC signal received at one terminal of the switchable capacitor to a second terminal, with very low IL. For example, a 1 pF capacitor at 28 GHz has an impedance of 5.7Ω, but results in a IL value of 0.014 dB. For comparison, a resistor of 5.7Ω would result in an IL value of 0.5 dB.

Furthermore, by using a capacitor as pass device no additional noise may be generated which may further improve the noise factor. The inventors of the present disclosure have appreciated that by using switchable capacitors rather than the conventional switch topologies, an RF switch for antennas with low IL may be implemented. The inventors have further appreciated that the RF switch 200 may in particular be used for systems with higher RF frequencies, for example frequencies above 10 GHz.

Figure 5:
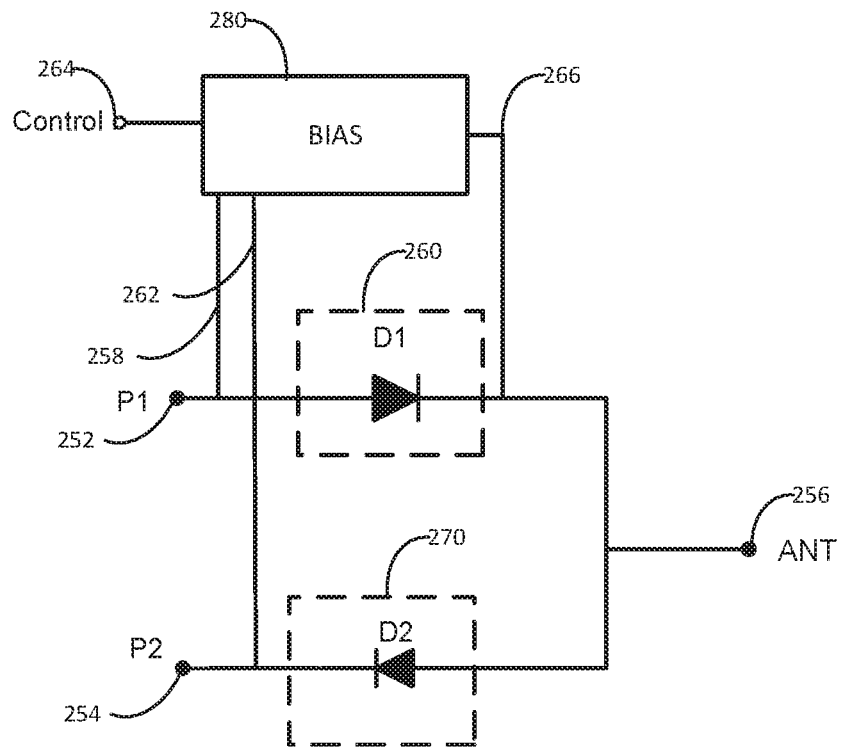
FIG. 5 illustrates an RF SPDT switch according to an embodiment.

FIG. 5 shows an RF switch 250 according to an embodiment. A first switchable capacitor 260 having diode D1 is connected between a first terminal 252 and a common terminal 256. A second switchable capacitor 270 having diode D2 is connected between a second terminal 254 and the common terminal 256. A bias circuit 280 may have a control input 264. The bias circuit 280 may have a first control output 258 connected to the first terminal 252. The bias circuit 280 may have a second control output 262 connected to the second terminal 254. The bias circuit 280 may have a third control output 266 connected to the common terminal 256.

In operation of the RF switch 250, in a first mode determined by a control signal received on the control input 264, the bias circuit 280 may forward bias diode D1 and reverse bias diode D2 by applying appropriate voltages and/or currents to the control outputs 258, 262, 266. The forward bias diode D1 may have a capacitance value much higher than the reverse biased diode D2. In this first mode of operation, the first switchable capacitor 260 is configured in an on-state or pass-state and the second switchable capacitor 270 is in an off-state or a blocking-state. During operation in this first mode, for example, an RF signal received on the common terminal 256 which might be connected to an antenna (not shown) may be passed via diode D1 to the first terminal 252 which may for example be connected to the input of the low noise amplifier (not shown).

In a second mode of operation determined by control signal received on the control input 264, the bias circuit 218 may reverse bias diode D1 and forward bias diode D2 by applying appropriate voltages and/or currents to the control outputs 258, 262, 266. Forward biased diode D2 may have a capacitance value that is much higher than the reverse biased diode D1. In the second mode of operation, the first switchable capacitor 260 is configured in an off state or blocking-state and the second switchable capacitor 270 is configured in an on-state or a pass state.

During operation in this second mode, for example, an RF signal transmitted on the second terminal 254 which might be connected to a power amplifier output (not shown) may be passed via diode D2 to the common terminal 256 which may for example be connected to an antenna (not shown).

In RF switch 250, the orientation of the diodes D1, D2 may be in either direction provided the bias circuit 280 provides the appropriate bias voltages and/or currents. This is because the diodes are being used to implement a switchable capacitor rather than the conventional diode function. In other examples, the diodes D1, D2 may be replaced by PiN diodes, varicap devices, or diode connected bipolar transistors.

Figure 6:
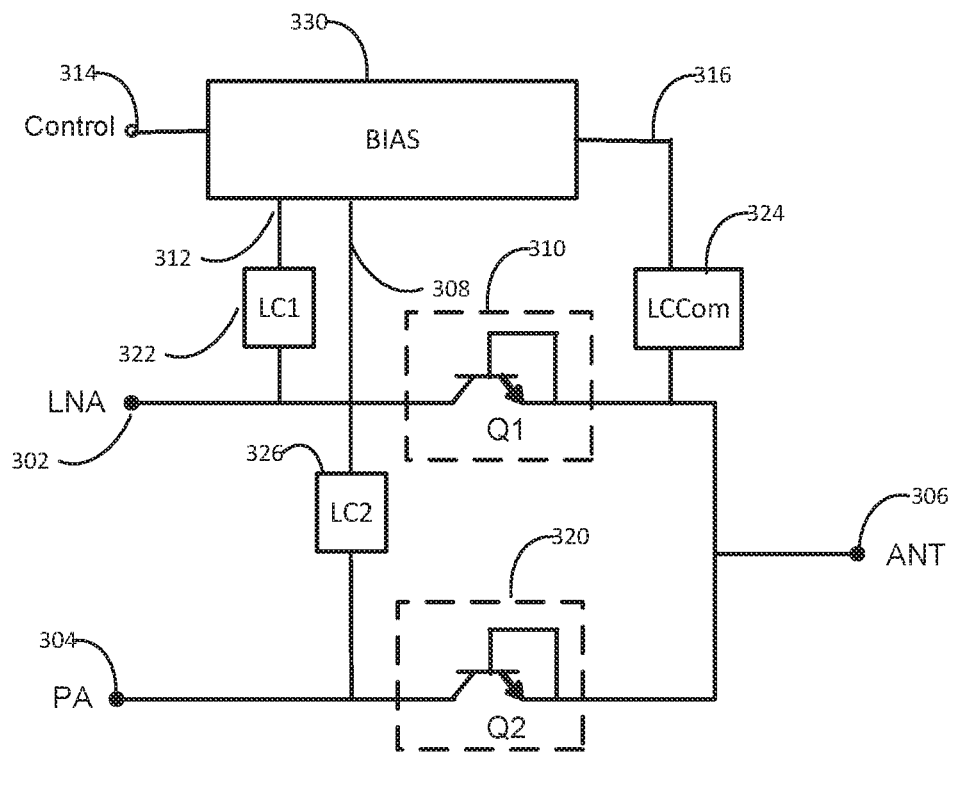
FIG. 6 shows an RF SPDT switch using reverse connected heterojunction bipolar transistors (HBT) according to an embodiment.

FIG. 6 shows an RF switch 300 according to an embodiment. A first switchable capacitor 310 having a diode-connected reverse transistor Q1 is connected between a first terminal 302 and a common terminal 306. A second switchable capacitor 320 having a diode-connected reverse transistor Q2 is connected between a second terminal 304 and the common terminal 306. The term diode-connected reverse transistor as used herein refers to a bipolar transistor such as a heterojunction bipolar transistor (HBT) with the base connected to the emitter. Such a transistor is being used in a configuration which is the reverse of the normal transistor operation. As illustrated in FIG. 6, Q1 and Q2 are shown as NPN transistors. In other examples PNP transistors may be used.

A bias circuit 330 may have a control input 314. The bias circuit 330 may have a first control output 312 connected to a first terminal of a first resonator 322. The bias circuit 330 may have a second control output 308 connected to a first terminal of a second resonator 326. The bias circuit 330 may have a third control output 316 connected to a first terminal of a third resonator 324. A second terminal of the first resonator 322 may be connected to the first terminal 302. A second terminal of the second resonator 326 may be connected to the second terminal 304. A second terminal of the third resonator 324 may be connected to the common terminal 306.

The resonators 322, 324, 326 may be implemented as a parallel LC circuit, as self resonating coils or by other circuit techniques. The resonators 322, 324,326 may have a relatively high impedance at the required RF frequency for example greater than 10 GHz and a much lower impedance at DC to supply any bias current with low voltage drop. The resonators 322, 324, 326 may also suppress out-of-band signals.

In operation of the RF switch 300, in a first mode determined by a control signal received on the control input 314, the bias circuit 330 may forward bias the base-collector PN junction of transistor Q1 and reverse bias the base-collector PN junction of transistor Q2 by applying appropriate voltages and/or currents to the control outputs 312, 308, 316. In this first mode of operation, the first switchable capacitor 310 is configured in an on-state or pass-state and the second switchable capacitor 320 is in an off-state or a blocking-state. During operation in this first mode, for example, an RF signal received on the common terminal 306 which might be connected to an antenna (not shown) may be passed via transistor Q1 to the first terminal 302 which may for example be connected to the input of the low noise amplifier (not shown).

In a second mode of operation determined by control signal received on the control input 314, the bias circuit 330 may reverse bias the base-collector PN junction of transistor Q1 and forward bias the base-collector PN junction of transistor Q2 by applying appropriate voltages and/or currents to the control outputs 312, 308, 316. In the second mode of operation, the first switchable capacitor 310 is in an off state or blocking-state and the second switchable capacitor 320 is configured in an on-state or a pass state.

During operation in this second mode, for example, an RF signal transmitted on the second terminal 304 which might be connected to a power amplifier output (not shown) may be passed via transistor Q2 to the common terminal 306 which may for example be connected to an antenna (not shown).

The emitter connections of Q1 and Q2 as illustrated are connected to the common terminal 306. However, since Q1 and Q2 are being used as switchable capacitances rather than their conventional transistor function, the orientation of Q1 and Q2 is irrelevant provided the appropriate biasing used. Consequently, in other examples, one or both of Q1 and Q2 may be connected in the reverse direction to that shown.

For the RF switch 300, when transistors Q1 and Q2 are configured in the blocking or off-state mode, the breakdown voltage of the collector-base junction of transistors Q1 and Q2 is relatively high. This is especially true if Q1 and Q2 are implemented using a high voltage transistor which may use a collector with lower doping level compared to the high-speed transistor. The lower doping level also results in lower reverse collector-base capacitance which is required in the off-state. A large reverse bias voltage may also lower the collector-base capacitance. Since the off-state device should be able to withstand the potentially large signals of the pass path, a reverse bias voltage of about half the breakdown voltage may be optimal. In this case the maximal negative amplitude will hit the breakdown limit, while the maximal positive amplitude will hit the point where the device cannot maintain its off-state and starts turning on.

When bipolar transistors Q1 and Q2 are configured in the pass or on-state mode, the transit frequency fT of the reverse transistor may be much lower than a forward transistor. In some examples, the reverse transistor may have more than 10× less fT compared to the normal forward transistor. This means that more than 10× less current is needed to get a certain on-state diffusion capacitance. In some examples, the reverse transistor Q1 may be biased in the on-state beyond peak fT, for example at current densities 10× larger compared to current densities that yield maximal fT performance in order to further increase the diffusion capacitance.

A further benefit of the diode-connected reverse transistors Q1, Q2 is the presence of the emitter. Shorting the emitter to the base may protect the base-emitter junction for reverse voltages. But this does not make the emitter ineffective: the emitter will carry most bias current taking it away from the base by the beta of the reverse transistor. For example, if the reverse beta is 100 with a bias current of 4 mA, the base current will be only 40 uA. If the emitter was not present, then the full 4 mA would be driven into the p-type base. In the vertical structure of the emitter-base-collector NPN device there is a p-type substrate that makes a corresponding parasitic vertical PNP structure from the base-collector-substrate. Hence less bias current in the parasitic PNP may result in less injection of current into the substrate. Since substrate currents exhibit broadband noise, this is not only a benefit at DC, but also may improve NF at the operating frequency of the signals switched by the RF switch 300.

Figure 7A:
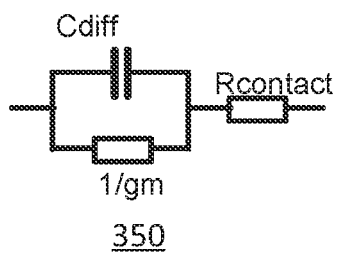
FIG. 7A shows an equivalent circuit of the HBT transistor of FIG. 6 on the on-state.

FIG. 7A shows the equivalent circuit 350 of the diode-connected reverse transistors Q1 and Q2 in the on-state or pass-state. The equivalent circuit 350 consists of a contact resistance Rcontact in series with a parallel arrangement of the diffusion capacitance Cdiff and a resistance 1/gm, where gm is the transconductance derived from the exponential bipolar IV transfer curve, and may be determined from the collector current divided by the thermal voltage kT/q. The collector current of transistors Q1 and Q2 is equivalent to the bias current when in the pass-state.

Figure 7B:
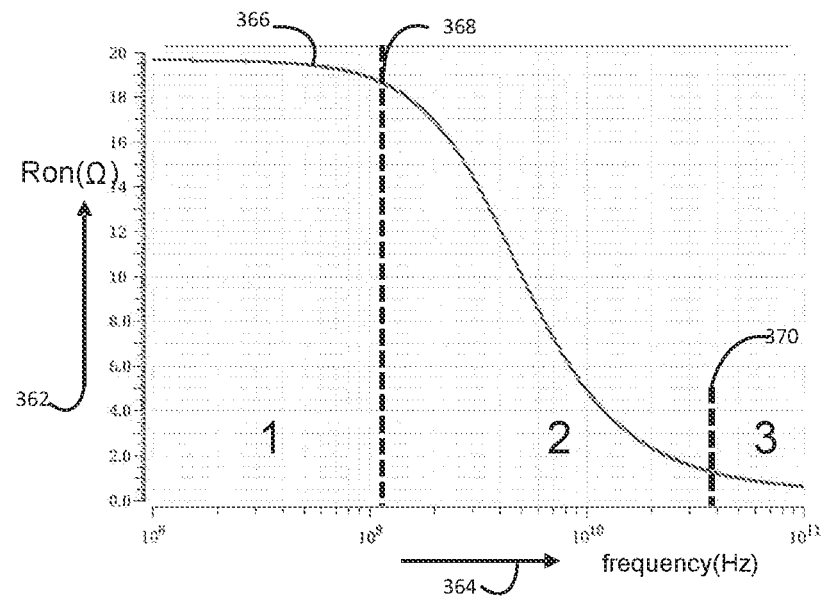
FIG. 7B illustrates the frequency dependent behaviour of the reverse connected HBT transistor of FIG. 6 in the on-state.

FIG. 7B shows a graph 360 of the on-state resistance Ron taken as real part of the on-state impedance of the forward biased collector base junction as a function of frequency according to the equivalent circuit 350. The y-axis 362 shows the on-resistance Ron in ohms varying between zero and 20 ohms. The x-axis 364 shows frequency on a logarithmic scale varying between the frequency of hundred megahertz to 100 GHz. Three regions are illustrated. Region 1 varies from a frequency of 100 MHz to approximately 2 GHz marked by dashed line 368. Region 2 varies between dashed line 368 at the value of approximately 2 GHz to dashed line 370 at the value of approximately 40 GHz. Region 3 covers the frequencies above 40 GHz. The line 366 show the variation in value of Ron. In the first region Ron is dominated by the value of 1/gm and is substantially constant. In the second region, the frequency becomes larger than the transit frequency of the transistor and the diffusion capacitance Cdiff starts to dominate more and more resulting in a reduced effective resistance Ron. In region 3, the contact resistance limits any further reduction in the value of the on-state resistance Ron.

By operating the RF switch 300 at frequencies where contact resistance dominates the value of Ron, the inventors of the present disclosure have appreciated that the RF signal flows predominantly through the diffusion capacitance and not through the diode conductance. In this way, an RF switch may be implemented having low insertion loss. The RF switch 300 may have low noise since the transconductance noise may be short-circuited by the diffusion capacitor. The RF switch 300 may have high small-signal linearity resulting in a higher value for the third order intercept point IP3, since the diffusion capacitor is largely constant because there is no modulation of the diode conductance. The RF switch 300 may have high large-signal linearity resulting in a higher value for the 1 dB compression point because the bias current through the diode conductance is not driven to zero by the RF current.

Figure 8A:
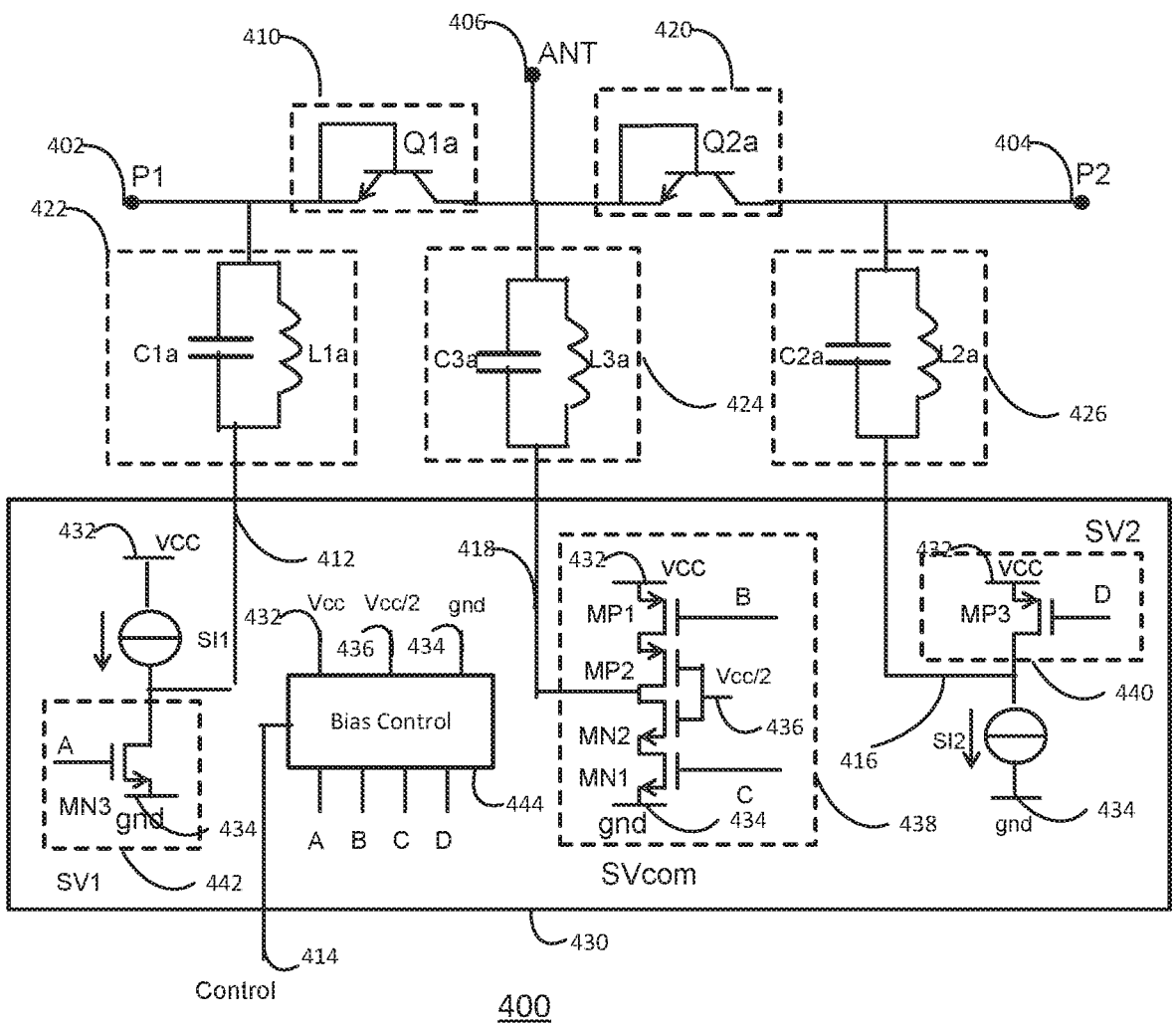
FIG. 8A shows an RF SPDT switch according to an embodiment.

FIG. 8A shows an RF switch 400 according to an embodiment. A first switchable capacitor 410 having a diode-connected reverse transistor Q1a is connected between a first terminal 402 and a common terminal 406. A second switchable capacitor 420 having a diode-connected reverse transistor Q2a is connected between a second terminal 404 and the common terminal 406. The term diode-connected reverse transistor as used herein refers to a bipolar transistor such as a heterojunction bipolar transistor (HBT) with the base connected to the emitter. Such a transistor is being used in a configuration which is the reverse of the normal transistor operation. As illustrated in FIG. 7, Q1a and Q2a are shown as NPN transistors. The emitter of Q1a is connected to the first terminal 402. The emitter of Q2a is connected to the common terminal 406.

A bias circuit 430 may have a control input 414. The bias circuit 430 may have a first control output 412 connected to a first terminal of a first resonator 422. The bias circuit 430 may have a second control output 416 connected to a first terminal of a second resonator 426. The bias circuit 430 may have a third control output 418 connected to a first terminal of a third resonator 424. A second terminal of the first resonator 422 may be connected to the first terminal 402. A second terminal of the second resonator 426 may be connected to the second terminal 404. A second terminal of the third resonator 424 may be connected to the common terminal 406.

The first resonator 422 may include a parallel arrangement of a capacitor C1a and an inductor L1a between the first resonator first terminal and the first resonator second terminal. The second resonator 426 may include a parallel arrangement of a capacitor C2a and an inductor L2a between the second resonator first terminal and the second resonator second terminal. The third resonator 424 may include a parallel arrangement of a capacitor C3a and an inductor L3a between the third resonator first terminal and the third resonator second terminal.

Bias circuit 430 may include a first switchable current source SI1 arranged between the supply rail 432 configured to supply a voltage Vcc and the first control output 412. The bias circuit 430 may include a first switchable voltage source 442. The first switchable voltage source 442 may have an NMOS transistor MN3 with a source connected to a common supply rail 434 which may be a ground, a drain connected to the first control output 412, and a gate connected to node A.

Bias circuit 430 may include a second switchable current source SI2 arranged between the common supply rail 434 and the second control output 416. The bias circuit 430 may include a second switchable voltage source 440. The second switchable voltage source 440 may have a PMOS transistor MP3 with a source connected to the supply rail 432, a drain connected to the second control output 416, and a gate connected to node D.

The bias circuit 430 may include a common switchable voltage source 438. The common switchable voltage source 438 may include a series cascode arrangement of a first and second PMOS transistors MP1 and MP2 between the supply rail 432 and the third control output 418. The common switchable voltage source 438 may include a series cascode arrangement of a first and second NMOS transistors MN1 and MN2 between the common rail 434 and the third control output 418. The gate of first PMOS transistor MP1 may be connected to node B. The gates of second PMOS transistor MP2, and second NMOS transistor MN2 may be connected to bias supply rail 436 which may supply a voltage of Vcc/2. The gate of first NMOS transistor MN1 may be connected to node C. Using a cascode arrangement allows MOS transistors which operate at lower voltages for example 2.5 volts to be used with a higher supply voltage level Vcc, for example 5 volts. In other examples, the cascode arrangement may be replaced by a single PMOS and NMOS transistor. The bias circuit 430 does not require a charge pump to generate negative voltages or voltages larger than Vcc.

The bias circuit 430 may include a bias control 444 having an input connected to the control input 414 which may be a control bus. The bias control 444 may be connected to supply rail 432, bias supply 436 and common rail 434. The bias control 444 may have four outputs connected to nodes A, B, C, D respectively.

In operation of the RF switch 400, in a first mode which may be determined by a control signal received on the control input 414, the bias circuit 430 may forward bias the base-collector PN junction of transistor Q1a and reverse bias the base-collector PN junction of transistor Q2a by applying a forward current to Q1a and a reverse voltage to Q2a. In this first mode of operation, the first switchable capacitor 410 is configured in an on-state or pass-state and the second switchable capacitor 420 is in an off-state or a blocking-state. During operation in this first mode, for example, an RF signal received on the common terminal 406 which might be connected to an antenna (not shown) may be passed via transistor Q1a to the first terminal 402 which may for example be connected to the input of the low noise amplifier (not shown).

In this first mode, the bias current is supplied by the first switchable bias current source SI1. The second switchable bias source SI2 is switched off by some means of control (not shown). The reverse bias voltage may be generated by the switchable voltage sources 438, 440, 442 under control of the bias control 444.

When SI1 is turned on, Q1a will be turned on, and SI2/Q2a are off. The voltage on common terminal 406 is low at around ground potential because the NMOS transistors MN1, MN2 in the switchable voltage source 438 are turned on. PMOS transistor MP3 in switchable voltage source 440 is turned on to make a reverse bias for Q2a equal to Vcc, which may be for example 5V. NMOS transistor MN3 in switchable voltage source 442 is off because the voltage at that point is already determined by the forward voltage of Q1a. In the first mode, the common terminal 406 is effectively connected to first terminal 402 for RF signals.

In a second mode of operation determined by control signal received on the control input 414, the bias circuit 430 may reverse bias the base-collector PN junction of transistor Q1a and forward bias the base-collector PN junction of transistor Q2a by applying a reverse voltage to Q1a and a forward current to Q1b. In the second mode of operation, the first switchable capacitor 410 is in an off state or blocking-state and the second switchable capacitor 420 is configured in an on-state or a pass state.

During operation in this second mode, for example, an RF signal transmitted on the second terminal 404 which might be connected to a power amplifier output (not shown) may be passed via transistor Q2a to the common terminal 406 which may for example be connected to an antenna (not shown).

In this second mode, the bias current is supplied by the second switchable bias current source SI2. The first switchable bias current source SI1 is switched off. The reverse bias voltage may be generated by the switchable voltage sources 438, 440, 442 under control of the bias control 444.

All switchability is reversed in the second mode compared to the first mode. When SI2/Q2a are on, common terminal 406 is high at around Vcc, and is connected to the second terminal 404 while first terminal 402 is isolated by off-state Q1a with Vcc reverse voltage. It will be appreciated that in a RF communication system such as a 5G base station or mobile device, either first terminal 402 or second terminal 404 can be connected to a LNA or PA.

The bias control 444 may generate voltages on each of the output nodes A, B, C and D as indicated in table 1 for the first mode and the second mode. It will be appreciated that the circuitry of bias control 444 may for example be implemented as an analog multiplexer controlled by the control input 414.

TABLE 1

| Circuit Node | First Mode - Pass State Q1a (High Cap), Blocking StateQ2a (Low Cap) | Blocking State Q1a (Low Cap), Pass State Q2a (High Cap) |
| --- | --- | --- |
| A | gnd | Vcc/2 |
| B | Vcc | Vcc/2 |
| C | Vcc/2 | gnd |
| D | Vcc/2 | Vcc |

The RF switch 400 may be used to implement switchable capacitors with a blocking or off-state capacitance value for example of Coff of approximately 12 fF and a pass or on-state capacitance value Con of approximately 3 pF at a few milliamps of bias current.

The LC parallel resonators 422, 424, 426 may exhibit high impedance at the required 5G frequencies, and low impedance at DC to enable passing current with low voltage drop. Hence, the resonators 422, 424, 426 may isolate the bias circuitry 430 from the RF signal path which runs from either first terminal 402 or second terminal 404 to the common terminal 406. The output impedance of the current sources SI1 and SI2 in the bias circuitry 430 may not be high enough at the RF signal frequencies. This may result in the current sources loading the RF signal path and so reducing the insertion loss. By isolating the bias circuit using the resonators 422, 424, 426, the insertion loss may be reduced. The LC resonators 422,424, 426 may also add selectivity which may be desired to suppress out-of-band signals. In some examples, the resonators 422,424,426 may be implemented as self-resonating coils. In a self-resonating coil, the parallel C is parasitic of the coil structure. Using LC resonators rather than an inductance alone may reduce the size of the required inductance coil.

The RF switch 400 allows the full supply voltage Vcc to be used as reverse blocking voltage for the junction. This gives minimal off-state capacitance and may be an optimal voltage relative to breakdown voltages of 2×Vcc which may be approximately 10V.

Figures 8B, 8C:
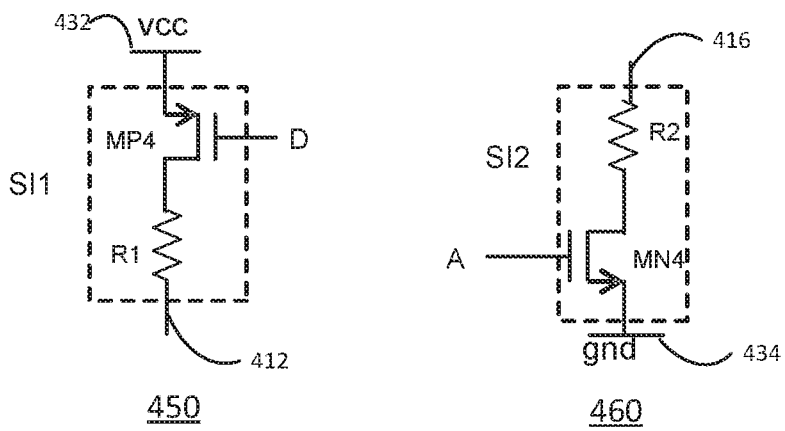
FIG. 8B illustrates an example switchable current bias source for the embodiment of FIG. 8A.
FIG. 8C shows an example switchable current bias source for the embodiment of FIG. 8A.

FIG. 8B shows an example implementation of a switchable current source 450 which may be used to implement current source SI1 in the RF switch 400 shown in FIG. 8A A series arrangement of a PMOS transistor MP4 and a resistor R1 may be connected between a supply rail 432 and a first control output 412. The gate of the PMOS transistor MP4 may be connected to a node D as illustrated in RF switch 400. In operation, the PMOS transistor MP4 may be controlled by the bias control circuit 444 to provide a bias current in the first mode of operation. It will be appreciated that in other examples, different implementations of switchable current sources may also be used.

FIG. 8C shows an example implementation of a switchable current source 460 which may be used to implement current source SI2 in the RF switch 400 shown in FIG. 8A. A series arrangement of a NMOS transistor MN4 and a resistor R2 may be connected between a common rail 434 and a second control output 416. The gate of the NMOS transistor MN4 may be connected to a node A as illustrated in RF switch 400. In operation, the NMOS transistor MN4 may be controlled by the bias control circuit 444 to provide a bias current in the second mode of operation. It will be appreciated that in other examples, different implementations of switchable current sources may also be used.

Figure 9A:
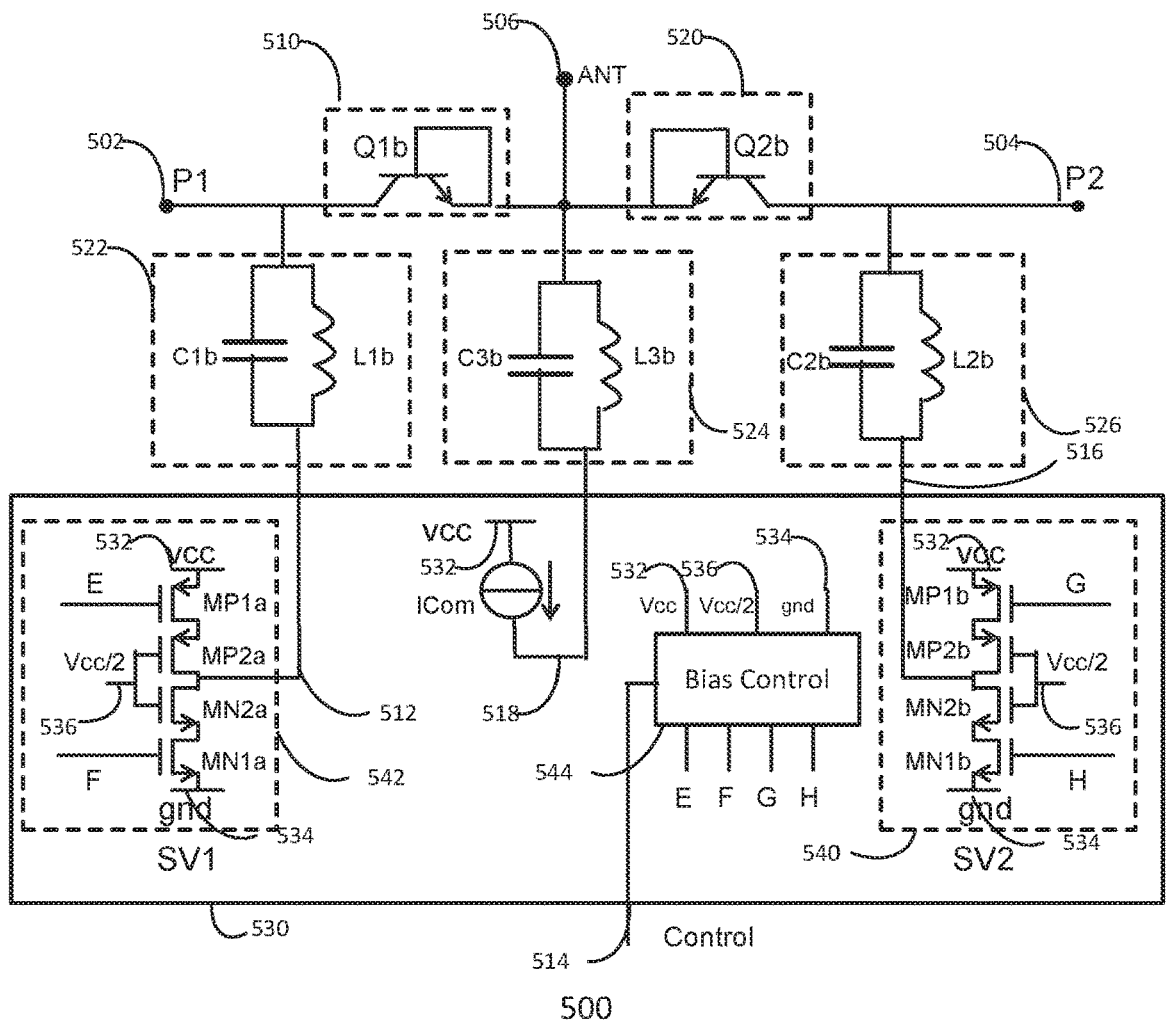
FIG. 9A shows an RF SPDT switch according to an embodiment.

FIG. 9A shows an RF switch 500 according to an embodiment. A first switchable capacitor 510 having a diode-connected reverse transistor Q b is connected between a first terminal 502 and a common terminal 506. A second switchable capacitor 520 having a diode-connected reverse transistor Q2b is connected between a second terminal 504 and the common terminal 506. The term diode-connected reverse transistor as used herein refers to a bipolar transistor such as a heterojunction bipolar transistor (HBT) with the base connected to the emitter. As illustrated in FIG. 9A, Q1b and Q2b are shown as NPN transistors. In other examples, PNP transistors, diodes or varicaps may be used. The emitter of Q1b is connected to the common terminal 506. The emitter of Q2b is connected to the common terminal 506.

A bias circuit 530 may have a control input 514. The bias circuit 530 may have a first control output 512 connected to a first terminal of a first resonator 522. The bias circuit 530 may have a second control output 516 connected to a first terminal of a second resonator 526. The bias circuit 530 may have a third control output 518 connected to a first terminal of a third resonator 524. A second terminal of the first resonator 522 may be connected to the first terminal 502. A second terminal of the second resonator 526 may be connected to the second terminal 504. A second terminal of the third resonator 524 may be connected to the common terminal 506.

The first resonator 522 may include a parallel arrangement of a capacitor C1b and an inductor L1b between the first resonator first terminal and the first resonator second terminal. The second resonator 526 may include a parallel arrangement of a capacitor C2b and an inductor L2b between the second resonator first terminal and the second resonator second terminal. The third resonator 524 may include a parallel arrangement of a capacitor C3b and an inductor L3b between the third resonator first terminal and the third resonator second terminal.

Bias circuit 530 may include a current source ICom arranged between the supply rail 532 configured to supply a voltage Vcc and the third control output 518.

The bias circuit 530 may include a first switchable voltage source 542. The first switchable voltage source 542 may include a series arrangement of a first and second PMOS transistors MP1a and MP2a between the supply rail 532 and the first control output 512. The first switchable voltage source 542 may include a series arrangement of a first and second NMOS transistors MN1a and MN2a between the common rail 534 and the first control output 512. The gate of first PMOS transistor MP1a may be connected to node E. The gates of second PMOS transistor MP2a, and second NMOS transistor MN2a may be connected to bias supply rail 536 which may supply a voltage of Vcc/2. The gate of first NMOS transistor MN1a may be connected to node F.

The bias circuit 530 may include a second switchable voltage source 540. The second switchable voltage source 540 may include a series cascode arrangement of a first and second PMOS transistors MP1b and MP2b between the supply rail 532 and the second control output 516. The second switchable voltage source 540 may include a series cascode arrangement of a first and second NMOS transistors MN1b and MN2b between the common rail 534 and the second control output 516. The gate of first PMOS transistor MP1b may be connected to node G. The gates of second PMOS transistor MP2b, and second NMOS transistor MN2b may be connected to bias supply rail 536 which may supply a voltage of Vcc/2. The gate of first NMOS transistor MN1b may be connected to node H. The bias circuit 530 does not require a charge pump to generate negative voltages or voltages larger than Vcc.

The bias circuit 530 may include a bias control 544 having an input connected to the control input 514 which may be a control bus. Bias control 544 may be connected to supply rail 532, bias supply 536 and common rail 534. The bias control 544 may have four outputs connected to nodes E, F, G, H respectively.

In operation of the RF switch 500, the current source ICom is always on and results in a voltage at the common terminal 506 of approximately the forward voltage of Q1b or Q2b respectively.

In a first mode which may be determined by a control signal received on the control input 514, the bias circuit 530 may forward bias the base-collector PN junction of transistor Q1b and reverse bias the base-collector PN junction of transistor Q2b by applying a forward current to Q1b and a reverse voltage to Q2b. In this first mode of operation, the first switchable capacitor 510 is configured in an on-state or pass-state and the second switchable capacitor 520 is in an off-state or a blocking-state. During operation in this first mode, for example, an RF signal received on the common terminal 506 which might be connected to an antenna (not shown) may be passed via transistor Q1b to the first terminal 502 which may for example be connected to the input of the low noise amplifier (not shown).

In a second mode which may be determined by a control signal received on the control input 514, the bias circuit 530 may reverse bias the base-collector PN junction of transistor Q1b and forward bias the base-collector PN junction of transistor Q2b by applying a forward current to Q2b and a reverse voltage to Q1b. In this second mode of operation, the first switchable capacitor 510 is configured in an off-state or blocking-state and the second switchable capacitor 520 is in an on-state or a pass-state. During operation in this first mode, for example, an RF signal received on the second terminal 504 which might be connected to a power amplifier (not shown) may be passed via transistor Q2b to the common terminal 506 which may for example be connected to an antenna (not shown).

The bias control 544 may generate voltages on each of the output nodes E, F. G and H as indicated in table 2 below for the first mode and the second mode. It will be appreciated that the circuitry of bias control 544 may for example be implemented as an analog multiplexer controlled by the control input 514.

TABLE 2

| Circuit Node | First Mode - Pass state Q1b (High Cap), Blocking state Q2b (Low Cap) | Blocking state Q1b (Low Cap), Pass state Q2b (High Cap) |
|---|---|---|
| E | Vcc | Vcc/2 |
| F | Vcc/2 | Gnd |
| G | Vcc/2 | Vcc |
| H | gnd | Vcc/2 |

In the first mode, the first terminal 502 is connected to ground 534 via the NMOS transistors MN1a, MN2a and the second terminal 504 is connected to Vcc 532 via PMOS transistors MP1b and MP2b. In the second mode, the first terminal 502 is connected to Vcc 532 via the PMOS transistors MP1a. MP2a and the second terminal 504 is connected to ground 534 via NMOS transistors MN1b and MN2b.

The RF switch 500 may be used for example to implement switchable capacitors with a blocking or off-state capacitance value for example of Coff of approximately 12 fF and a pass or on-state capacitance value Con of approximately 3 pF at a few milliamps of bias current. This RF switch 500 may have a low insertion loss. Since emitters of both Q1b and Q2b are connected to the common terminal 506, noise due to parasitic connections from collector to the substrate in the blocked path is reduced.

Figure 9B:
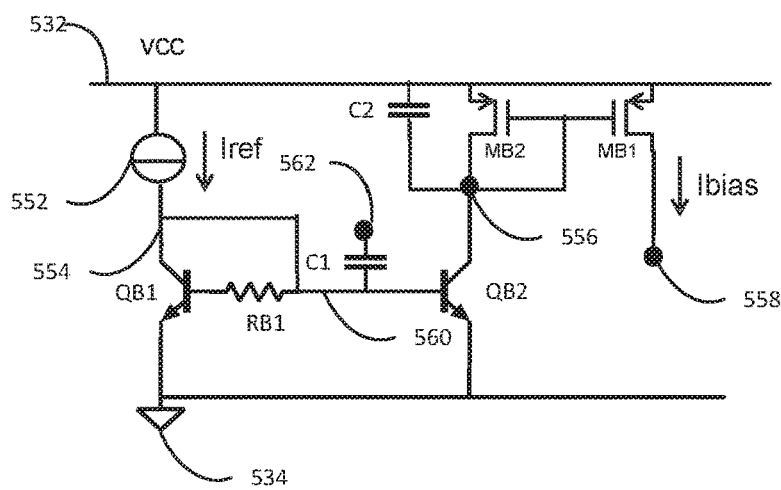
FIG. 9B illustrates an example power adaptive current source for the embodiment of FIG. 9A.

FIG. 9B shows a power adaptive current bias source 550 which may be used for the current source ICOM in RF switch 500. The power adaptive current bias source 550 may include a first current mirror formed from NPN bipolar bias transistors QB1 and QB2 and a second current mirror formed using PMOS transistors MB1 and MB2. A current reference 552 may be arranged between supply rail 532 and a collector of first bias transistor QB1. The first bias transistor QB1 may have a base connected to a first terminal of resistance RB1. The first bias transistor QB1 may have an emitter connected to a common rail 534. The second terminal of resistance RB1 may be connected to the base 560 of a second bias transistor QB2. A first capacitor C1 may be connected between an RF input 562 and the base 560 of the second transistor QB2. The RF input 562 may typically be connected to a power amplifier (not shown) that has an output connected to either first terminal 502 or the second terminal 504 of the RF switch 500. For a power amplifier with multiple amplifier stages, the RF input 562 may be connected to the input of the final amplifier stage. In other examples, the RF input 562 may be connected to the first terminal 502, the second terminal 504 or the common terminal 506.

The collector 556 of second bias transistor QB2 may be connected to the gate of first PMOS transistor MB2 and the gate of second PMOS transistor MB2. The collector 556 of the second bias transistor QB2 may be connected to a first terminal of second capacitor C2. The second terminal of second capacitor C2 may be connected to the supply rail 532. The collector 556 of second bias transistor QB2 may be connected to the drain of second PMOS transistor MB2. The source of first PMOS transistor MB1 and the source of second PMOS transistor MB2 may be connected to the supply rail 532. The drain of first PMOS transistor MB1 may be connected to the second control output 518.

In operation of the power-adaptive bias circuit 550, a reference current Iref provided by the current source 552 may be copied by the current mirror formed from QB1 and QB2 in a ratio determined by the relative dimensions of the two transistors QB1 and QB2. For example, transistor QB2 may be dimensioned such that the collector current of QB2 is 10 times the reference current Iref. The current provided by QB2 is then copied by the current mirror formed by PMOS transistors MB1 and MB2 to provide a bias current Ibias to the common terminal 506 of the RF switch 500.

In operation, an RF signal received on the RF input 562 may increase the base current of QB2 and consequently increase the collector current of QB2 and therefore the bias current provided by the current mirror formed by PMOS transistors MB1 and MB2. The bias current may vary above a minimum quiescent current value depending on the power of the RF signal.

Low bias currents in general approximately 1 mA may be preferred to achieve low power consumption and so reduce the thermal heat of the IC. The associated small signal IP3 linearity at approximately 40 dBm may be sufficient, but the large signal P1$d$B compression may not be sufficient at approximately 10 dBm at these low bias currents. By increasing the bias current (only) when the power is large, the overall power consumption may be reduced while keeping the required switch performance.

It will be appreciated that the adaptive current bias circuit may also be implemented as a switchable current source and used in other embodiments of RF switches described herein.

Embodiments described may be used to implement RF switches with a low insertion loss IL which may be approximately 0.5 dB or less. This IL may be a 1 dB improvement on known RF switches. A 1 dB improvement enables a PA to lower its bias current with more than a few milliamps (mA) because it can drop its maximum Pout with 1 dB for the same output power at the antenna. This 1 dB improvement may also lower the NF of the receiver by 1 dB.

The embodiments illustrated implement RF SPDT switches. It will be appreciated that in other examples, different configurations of RF switches may be implemented.

Embodiments of the RF switches may be included in the RF communication system 100 to replace the SPDT switches 110, 120. Embodiments of the RF switches may be used to implement millimetre Wave (mmW) RF switches.

In other examples, embodiments of the RF switches may be used in other high frequency wireless applications like 5G Mobile, radar, satellite or dedicated short range communications (DSRC) for automotive operating at frequencies greater than 10 GHz which can benefit from the described methods of achieving a low insertion loss. The higher the frequency the less current is needed to get to the desired operating mode where diffusion capacitance starts dominating over the (non-linear) diode conductance. Alternatively, at lower frequencies at a few GHz, for example for applications like 4G Mobile or WLAN, the RF switches described herein may be used at higher bias currents.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An RF switch for connecting an antenna to a transceiver, the RF switch comprising a first switchable capacitor arranged between a first terminal and a common terminal and a second switchable capacitor arranged between a second terminal and the common terminal, wherein each of the first and second switchable capacitors are switchable between a pass state and a blocking state wherein the capacitance value in the pass state is higher than the capacitance value in the blocking state, wherein the RF switch further comprises a bias circuit having a control input and configured to bias the switchable capacitors in either the blocking state or the pass state in response to a control signal in the control input, the RF switch further comprising a first resonator circuit coupled to the first terminal, a second resonator circuit coupled to the second terminal and a third resonator coupled to the common terminal wherein the impedance of each resonator circuit is higher at RF frequencies than at DC.

2. The RF switch of claim 1 wherein the first, second and third resonator circuits are coupled to the bias circuit.

3. The RF switch of claim 1 wherein the first, second and third resonator circuits comprise self-resonating coils.

4. The RF switch of claim 1 wherein the first and second switchable capacitor each comprise one of a diode-connected bipolar transistor, silicon diode, a silicon germanium diode, a PiN diode, and a varicap.

5. The RF switch of claim 1 configured as a SPDT switch wherein the common terminal is configured to be coupled to an antenna, the first terminal is configured to be coupled to an RF amplifier output and the second terminal is configured to be coupled to an RF amplifier input and wherein a first mode one of the first terminal and the second terminal is coupled to the common terminal and in a second mode the other of the first terminal and the second terminal is coupled to the common terminal.

6. The RF switch of claim 1 wherein the bias circuit is configured to supply a bias forward current to a respective switchable capacitor in the pass state and a reverse bias voltage to a respective switchable capacitor in the blocking state.

7. An RF switch for connecting an antenna to a transceiver, the RF switch comprising a first switchable capacitor arranged between a first terminal and a common terminal and a second switchable capacitor arranged between a second terminal and the common terminal, wherein each of the first and second switchable capacitors are switchable between a pass state and a blocking state wherein the capacitance value in the pass state is higher than the capacitance value in the blocking state, wherein the RF switch further comprises a bias circuit having a control input and configured to bias the switchable capacitors in either the blocking state or the pass state in response to a control signal in the control input, wherein the bias circuit is configured to supply a bias forward current to a respective switchable capacitor in the pass state and a reverse bias voltage to a respective switchable capacitor in the blocking state.

8. An RF switch of claim 7 wherein the first and second switchable capacitor each comprise one of a diode-connected bipolar transistor, silicon diode, a silicon germanium diode, a PiN diode, and a varicap.

9. A mobile device comprising the RF switch of claim 7.

10. A 5G transceiver comprising the RF switch of claim 7.

11. The RF switch of claim 7 configured as a SPDT switch wherein the common terminal is configured to be coupled to an antenna, the first terminal is configured to be coupled to an RF amplifier output and the second terminal is configured to be coupled to an RF amplifier input and wherein a first mode one of the first terminal and the second terminal is coupled to the common terminal and in a second mode the other of the first terminal and the second terminal is coupled to the common terminal.

12. An RF switch for connecting an antenna to a transceiver, the RF switch comprising a first switchable capacitor arranged between a first terminal and a common terminal and a second switchable capacitor arranged between a second terminal and the common terminal, wherein each of the first and second switchable capacitors are switchable between a pass state and a blocking state wherein the capacitance value in the pass state is higher than the capacitance value in the blocking state, wherein the RF switch further comprises a bias circuit having a control input and configured to bias the switchable capacitors in either the blocking state or the pass state in response to a control signal in the control input, wherein the bias circuit comprises a power-dependent adaptive current source configured to supply a bias forward current in dependence of the power of the RF signal.

13. An RF switch for connecting an antenna to a transceiver, the RF switch comprising a first switchable capacitor arranged between a first terminal and a common terminal and a second switchable capacitor arranged between a second terminal and the common terminal, wherein each of the first and second switchable capacitors are switchable between a pass state and a blocking state wherein the capacitance value in the pass state is higher than the capacitance value in the blocking state, wherein the RF switch further comprises a bias circuit having a control input and configured to bias the switchable capacitors in either the blocking state or the pass state in response to a control signal in the control input, wherein the bias circuit comprises a first switchable current source coupled to the first terminal, a first switchable voltage source coupled to the first terminal, a second switchable current source coupled to the second terminal, a second switchable voltage source coupled to the second terminal, and a common switchable voltage source coupled to the common terminal, wherein in a first mode of operation, the RF switch is configured to enable the first switchable current source, the second switchable voltage source and the common switchable voltage source to configure the first switchable capacitor in a pass-state and the second switchable capacitor in a blocking-state and in a second mode of operation to enable the second switchable current source, the first switchable voltage source and the common switchable voltage source to configure the first switchable capacitor in a blocking-state and the second switchable capacitor in a pass-state.

14. The RF switch of claim 13 wherein each of the first and second switchable capacitors comprises a respective bipolar transistor having a base connected to the emitter and wherein the collector of the first bipolar transistor and the emitter of the second bipolar transistor are connected to the common terminal.

15. The RF switch of claim 13 wherein the first and second switchable capacitor each comprise one of a diode-connected bipolar transistor, silicon diode, a silicon germanium diode, a PiN diode, and a varicap.

16. A mobile device comprising the RF switch of claim 13.

17. A 5G transceiver comprising the RF switch of claim 13.

18. An RF switch for connecting an antenna to a transceiver, the RF switch comprising a first switchable capacitor arranged between a first terminal and a common terminal and a second switchable capacitor arranged between a second terminal and the common terminal, wherein each of the first and second switchable capacitors are switchable between a pass state and a blocking state wherein the capacitance value in the pass state is higher than the capacitance value in the blocking state, wherein the RF switch further comprises a bias circuit having a control input and configured to bias the switchable capacitors in either the blocking state or the pass state in response to a control signal in the control input, wherein the bias circuit comprises a current source coupled to the common terminal, a first switchable voltage source coupled to the first terminal, and a second switchable voltage source coupled to the second terminal, wherein in a first mode of operation, the RF switch is configured to enable the first switchable voltage source, the second switchable voltage source to configure the first switchable capacitor in a pass state and the second switchable capacitor in a blocking state and in a second mode of operation to enable the first switchable voltage source and the second switchable voltage source to configure the first switchable capacitor in a blocking state and the second switchable capacitor in a pass state.

19. The RF switch of claim 18 wherein each of the first and second switchable capacitors comprises a respective bipolar transistor having a base connected to the emitter, and wherein the emitter of the first bipolar transistor and the emitter of the second bipolar transistor are connected to the common terminal.

20. A mobile device comprising the RF switch of claim 18.

* * * * *